US008543078B2

(12) United States Patent
Anegawa et al.

(10) Patent No.: US 8,543,078 B2
(45) Date of Patent: Sep. 24, 2013

(54) HARMONIC MIXER CIRCUIT

(75) Inventors: Osamu Anegawa, Kanagawa (JP);
Osamu Baba, Kanagawa (JP); Miki Kubota, Kanagawa (JP); Tsuneo Tokumitsu, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 272 days.

(21) Appl. No.: 13/076,871

(22) Filed: Mar. 31, 2011

(65) Prior Publication Data

US 2011/0241739 A1   Oct. 6, 2011

(30) Foreign Application Priority Data

Apr. 1, 2010 (JP) ................................ 2010-084997

(51) Int. Cl.
*H04B 1/40* (2006.01)
(52) U.S. Cl.
USPC ........................................ 455/323; 455/313
(58) Field of Classification Search
USPC .......................................... 455/313, 323, 326
See application file for complete search history.

(56) References Cited

U.S. PATENT DOCUMENTS

| | | | | |
|---|---|---|---|---|
| 6,064,872 A * | 5/2000 | Vice | ............................... | 455/326 |
| 6,317,590 B1 * | 11/2001 | Nash et al. | ..................... | 455/331 |
| 6,861,891 B2 * | 3/2005 | Romano | ........................ | 327/355 |
| 7,084,693 B2 * | 8/2006 | Romano | ........................ | 327/355 |
| 7,570,936 B2 * | 8/2009 | Vice | ............................... | 455/326 |
| 7,962,114 B2 * | 6/2011 | Garcia et al. | ................... | 455/323 |
| 8,249,541 B2 * | 8/2012 | Bao et al. | ....................... | 455/330 |

OTHER PUBLICATIONS

Herbert Zirath; "A subharmonically Pumped Resistive Dual-HEMT-Mixer", Dept. of Applied Electron Physics, Chalmers University of Technology, Goteborg, Sweden, IEEE MTT-S Digest, 1991, pp. 875-878.

* cited by examiner

*Primary Examiner* — Blane J Jackson
(74) *Attorney, Agent, or Firm* — Westerman, Hattori, Daniels & Adrian, LLP

(57) ABSTRACT

A circuit includes: a first line to which input and output signal terminals are connected; a first transistor having a first terminal connected to the first line, a second terminal connected to a ground potential, and a control terminal supplied with a first oscillation signal, the first transistor outputting the first signal and its harmonic component; a second transistor having a first terminal connected to the first line, a second terminal connected to the ground potential, and a control terminal supplied with a second oscillation signal, the second transistor outputting the second signal and its harmonic component; a first harmonic generator connected to the control terminal of the first transistor and generates a harmonic component including the harmonic component by the first transistor; and a second harmonic generator connected to the control terminal of the second transistor and generates a harmonic component including the harmonic component by the second transistor.

11 Claims, 5 Drawing Sheets

HARMONIC MIXER CIRCUIT

CROSS-REFERENCE TO RELATED APPLICATION

This application is based upon and claims the benefit of priority of the prior Japanese Patent Application No. 2010-084997, filed on Apr. 1, 2010, the entire contents of which are incorporated herein by reference.

BACKGROUND (i) Technical Field

A certain aspect of the embodiments discussed herein is related to an electronic circuit.

(ii) Related Art

In the millimeter wave band and the quasi-millimeter wave band, it is difficult to realize a stable local oscillator having a sufficient power. Thus, an electronic circuit such as a harmonic mixer that can be driven at low frequencies is used.

For example, the following document discloses a harmonic mixer configured to convert an input signal having a low frequency to an output signal having a high frequency: H. Zirath, 1991 IEEE MTT-S Dig., pp. 875-878.

However, the harmonic mixer has a problem that the input signal is deformed by a transistor and an unwanted harmonic signal is generated.

SUMMARY

According to an aspect of the present invention, there is provided an electronic circuit capable of restraining an unwanted harmonic signal from being output.

According to another aspect of the present invention, there is provided an electronic circuit including: a first transmission line to which an input signal terminal and an output signal terminal are connected; a first transistor having a first terminal connected to the first transmission line, a second terminal connected to a ground potential, and a control terminal supplied with a first oscillation signal, the first transistor outputting the first oscillation signal and a harmonic component thereof; a second transistor having a first terminal connected to the first transmission line, a second terminal connected to the ground potential, and a control terminal supplied with a second oscillation signal, the second transistor outputting the second oscillation signal and a harmonic component thereof; a first harmonic generation part connected to the control terminal of the first transistor and generates a harmonic component including the harmonic component generated by the first transistor; and a second harmonic generation part connected to the control terminal of the second transistor and generates a harmonic component including the harmonic component generated by the second transistor.

DETAILED DESCRIPTION

Figure 1:
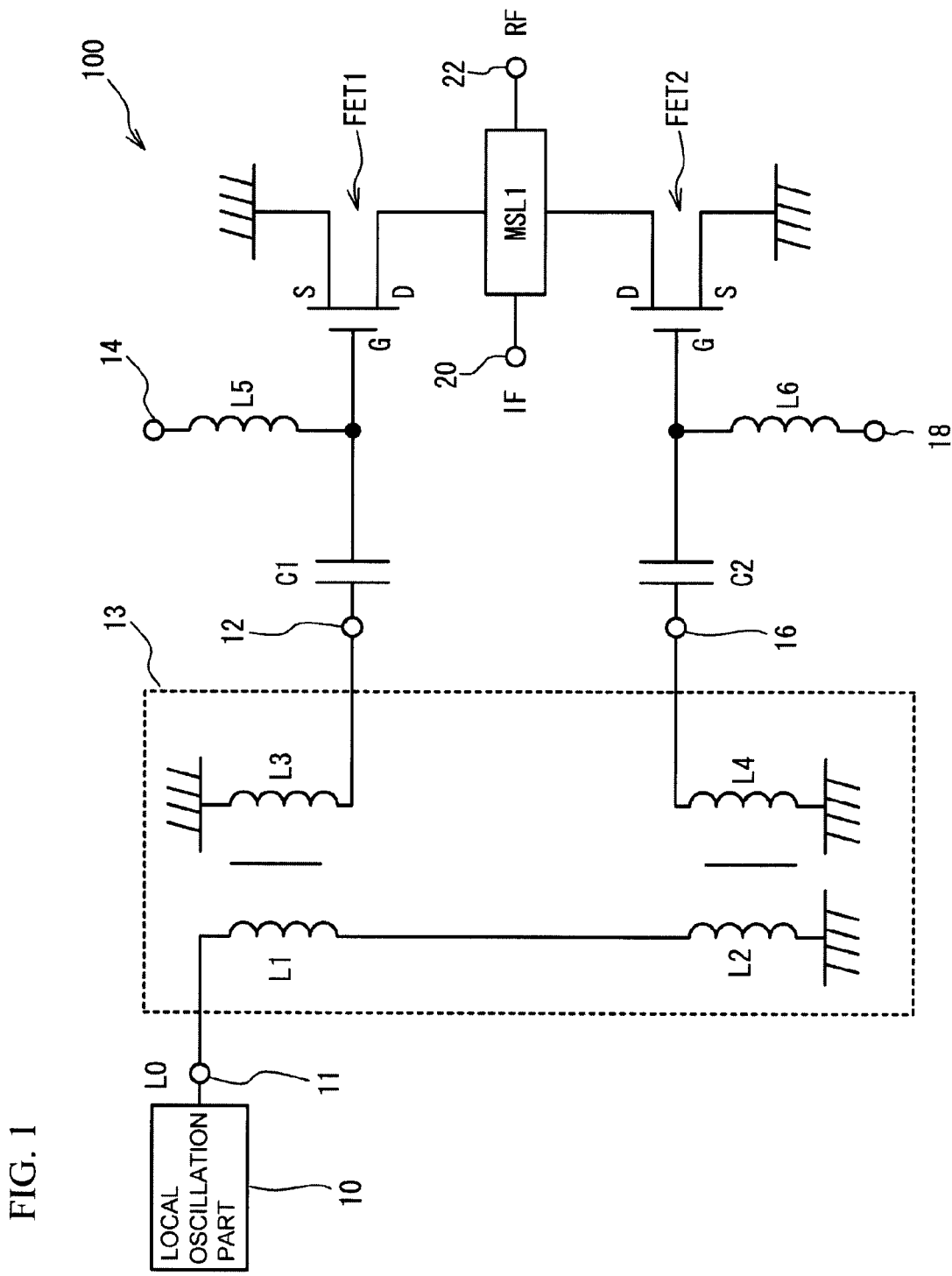
FIG. 1 is a circuit diagram of a harmonic mixer in accordance with a comparative example.

An electronic circuit of a comparative example is now described with reference to FIG. 1 for comparison with embodiments. FIG. 1 is a circuit diagram of a harmonic mixer 100 of the comparative example. Referring to FIG. 1, the harmonic mixer 100 has a local oscillation part 10, a balun circuit 13, condensers C1 and C2, coils L5 and L6, a first transistor FET1, a second transistor FET2, an input signal terminal 20, a first transmission line MSL1, and an output signal terminal 22.

The local oscillation part 10 and the balun circuit 13 form an oscillator that generates a first local oscillation signal (hereinafter, simply referred to as first LO signal), and a second local oscillation signal (hereinafter, simply referred to as second LO signal), which oscillation signals are 180° out of phase. The oscillator thus configured outputs the first and second LO signals to terminals 12 and 16, respectively. The local oscillation part 10 outputs a common oscillation signal LO to a terminal 11. The balun circuit 13 acts as a 180° coupler, which generates the first LO signal and the second LO signal from the common oscillation signal LO. As illustrated in FIG. 1, the balun circuit 13 includes four coils L1, L2, L3 and L4. The coils L1 and L2 are connected in series, and one end of the coil L2 is connected to a ground potential. A line from the terminal 11 to the coils L1 and L2 forms an unbalanced transmission line. One end of the coil L3 is connected to the ground potential and the other end thereof is connected to the terminal 12. Similarly, one end of the coil L4 is connected to the ground potential and the other end thereof is connected to the terminal 16. A line from the coil L3 to the terminal 12 and a line from the coil L4 to the terminal 16 form balanced transmission lines. The balanced transmission lines carry signals that are in the opposite phases. That is, there is a 180° phase difference between the first LO output to the terminal 12 and the second LO output to the terminal 16. The oscillator composed of the local oscillation part 10 and the balun circuit 13 may have another configuration. The coils L1, L2, L3 and L4 of the balun circuit 13 may be realized by lines having inductance components.

The condensers C1 and C2 remove DC components from the first and second LO signals applied to the terminals 12 and 16, respectively. Bias voltages for driving the first and second transistors FET1 and FET2 are applied to terminals 14 and 18, respectively. The bias voltages may be 0.7V, for example. The coils L5 and L6 are used to apply the bias voltages, and may be choke coils, for example.

An input signal (hereinafter referred to as IF signal) is applied to the input signal terminal 20 connected to one end of the first transmission line MSL1, and an output signal (hereinafter referred to as RF signal) is output via the output signal terminal 22 connected to the other end of the transmission line MSL1. The IF signal includes an information signal for transmitting. The RF signal is an up-converted signal of the IF signal based on signals of frequencies twice those of the first and second LO signals. For example, assuming that the frequencies of the first and second LO signals are denoted as $f_1$ and the frequency of the IF signal is denoted as $f_2$, the frequencies of the RF signal are described as $2 \cdot f_1 + f_2$ and $2 \cdot f_1 - f_2$. The first transmission line MSL1 may be a microstrip line, for example.

The first transistor FET1 and the second transistor FET2 may be field effect transistors of enhancement type. Terminals indicated by symbols G, S and D of the first transistor FET1 and the second transistor FET2 are respectively the gate, source and drain, and are similarly used in other figures. The gates G of the first and second transistors FET1 and FET2 are control terminals, the sources and drains thereof are first and second terminals or vise versa. The sources S of the first and second transistors FET1 and FET2 are connected to the ground potential, and the first and second LO signals are applied to the gates G thereof, respectively. The drains D of the first and second transistors FET1 and FET2 are connected to the first transmission line MSL1. The first and second transistors FET1 and FET2 are inverted type amplifiers, and the signal applied to the gate and the signal output via the drain have a 180° phase difference in each transistor. When the phase of the first LO signal applied to the gate of the first transistor FET1 is used as a reference, the first LO signal output from the drain of the first transistor FET1 is 180° out of phase, and the second LO signal output from the drain of the second transistor FET2 is 0° (360°) out of phase. Thus, the first LO signal and the second LO signal respectively output from the first and second transistors FET1 and FET2 to the first transmission line MSL1 are mutually canceled, and are not output via the output signal terminal 22.

The first and second transistors FET1 and FET2 derive harmonic components from the input signals applied thereto. In each transistor, the phase and frequency of the harmonic component are twice those of the input signal, and this harmonic component is a second harmonic. When the phase of the signal applied to the gate of the first transistor FET1 is used as a reference, the second harmonic output from the drain of the first transistor FET1 has a phase difference P1 of 0°, and the second harmonic output from the drain of the second transistor FET2 has a phase difference P2 of 0° (360°). Thus, the second harmonics applied to the first transmission line MSL1 from the first and second transistors FET1 and FET2 are mutually emphasized, and the second harmonic is output from the output signal terminal 22.

Figure 2:
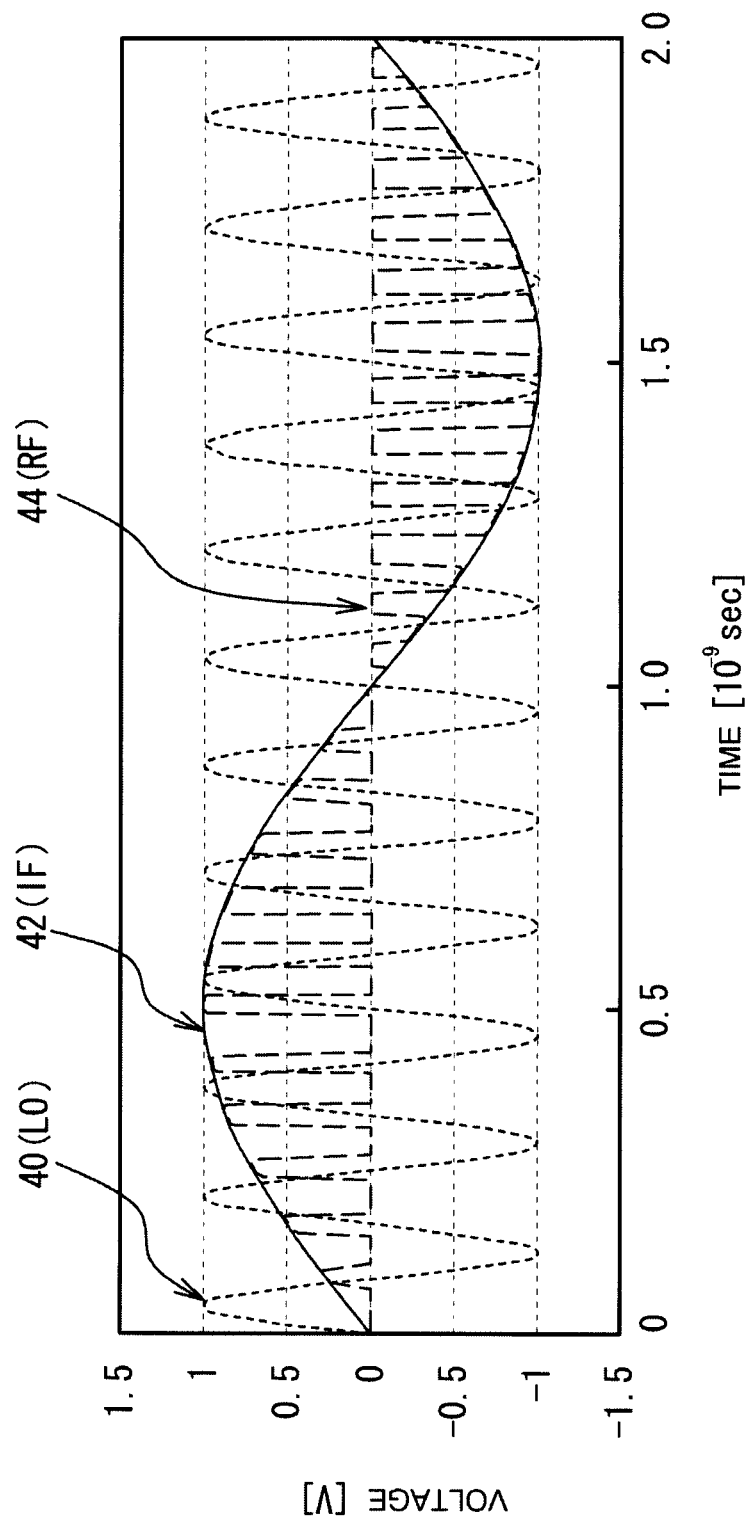
FIG. 2 is a graph of a local oscillation (LO) signal, an intermediate frequency (IF) signal and a radio frequency (RF) signal.

A description will now be given, with reference to FIGS. 1 and 2, of operations of the first and second transistors FET1 and FET2 and a relationship between the first LO signal, the IF signal and the RF signal. FIG. 2 is a graph of the first LO signal, the IF signal and the RF signal involved in the comparative example. The horizontal axis of FIG. 2 denotes the time [$10^{-9}$ sec], and the vertical axis thereof denotes the voltage [V]. A dotted line 40, a solid line 42 and a broken line 44 correspond to the LO signal, the IF signal and the RF signal, respectively. The dotted line 40 is the first LO signal applied to the gate of the first transistor FET1. The first transistor FET1 is turned ON when the voltage of the first LO signal applied to the gate terminal is equal to or higher than 0.5 V. Thus, as illustrated in FIG. 2, the first transistor FET1 is turned ON only once every cycle. The second LO signal (not illustrated in FIG. 2) applied to the second transistor FET2 is the inverse of the first LO signal of the dotted line 40. Like the first transistor FET1, the second transistor FET2 is turned ON when the voltage of the second LO signal is equal to or higher than 0.5 V. Thus, the second transistor FET2 is turned ON only once every cycle. However, the timing of the above state change of the second transistor FET2 differs from that of the first transistor FET1 by a half cycle. When the amplitude of one of the first and second LO signals exceeds a predetermined value and the corresponding one of the first and second transistors FET1 and FET2 is turned ON, the first and second transistors FET1 and FET2 are alternately turned ON and OFF at a frequency twice those of the first and second LO signals. As illustrated in FIG. 2, when the amplitudes of the first and second LO signals are zero, both the first and second transistors FET1 and FET2 are OFF. When one of the first and second transistors FET1 and FET2 is ON, the first transmission line MSL1 is connected to the ground potential, the RF signal is not output from the first transmission line MSL1. When both the first and second transistors FET1 and FET2 are OFF, the RF signal is output from the first transmission line MSL1. As described above, the RF signal based on the signal of the frequency twice the frequency $f_1$ of the first and second LO signals and the IF signal is output from the first transmission line MSL1.

Figure 3:
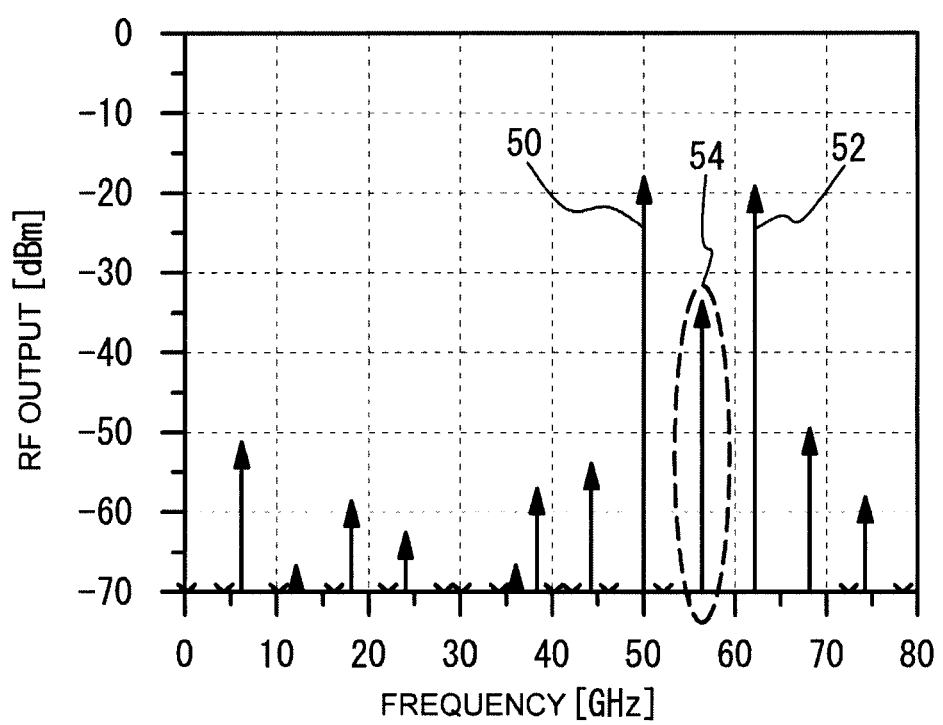
FIG. 3 is a graph of simulation results of the harmonic mixer of the comparative example.

The frequency spectrum of the RF signal output by the harmonic mixer 100 is now described with reference to FIG. 3. FIG. 3 illustrates simulation results of the harmonic mixer 100 of the comparative example, and is a graph of a frequency spectrum of the RF signal obtained when the frequency $f_1$ (primary wave component) of the first and second LO signals is 28 GHz and the frequency $f_2$ of the IF signal is 6 GHz. The horizontal axis of FIG. 3 denotes the frequency [GHz], and the vertical axis denotes power [dBm]. As illustrated by solid lines 50 and 52, the RF signal is comparatively strong at frequencies 50 GHz and 62 GHz. This is because the second harmonic, which is a harmonic component, is generated at the first and second transistors FET1 and FET2. As a solid line surrounded by a broken line, the second harmonic of 56 GHz twice the frequency $f_1$ of the first and second LO signals is emphasized.

Since the harmonic component such as the second harmonic described above in connection with the comparative example is noise, it is preferable to restrain the harmonic component from being output. As illustrated in FIG. 3, the solid lines 50 and 52 are close to the solid line surrounded by the broken line 54, and it is difficult to eliminate the harmonic component unless an expensive filter having a sharp attenuation characteristic is employed.

According to an aspect of embodiments described below, the above difficulty is removed.

Figure 4:
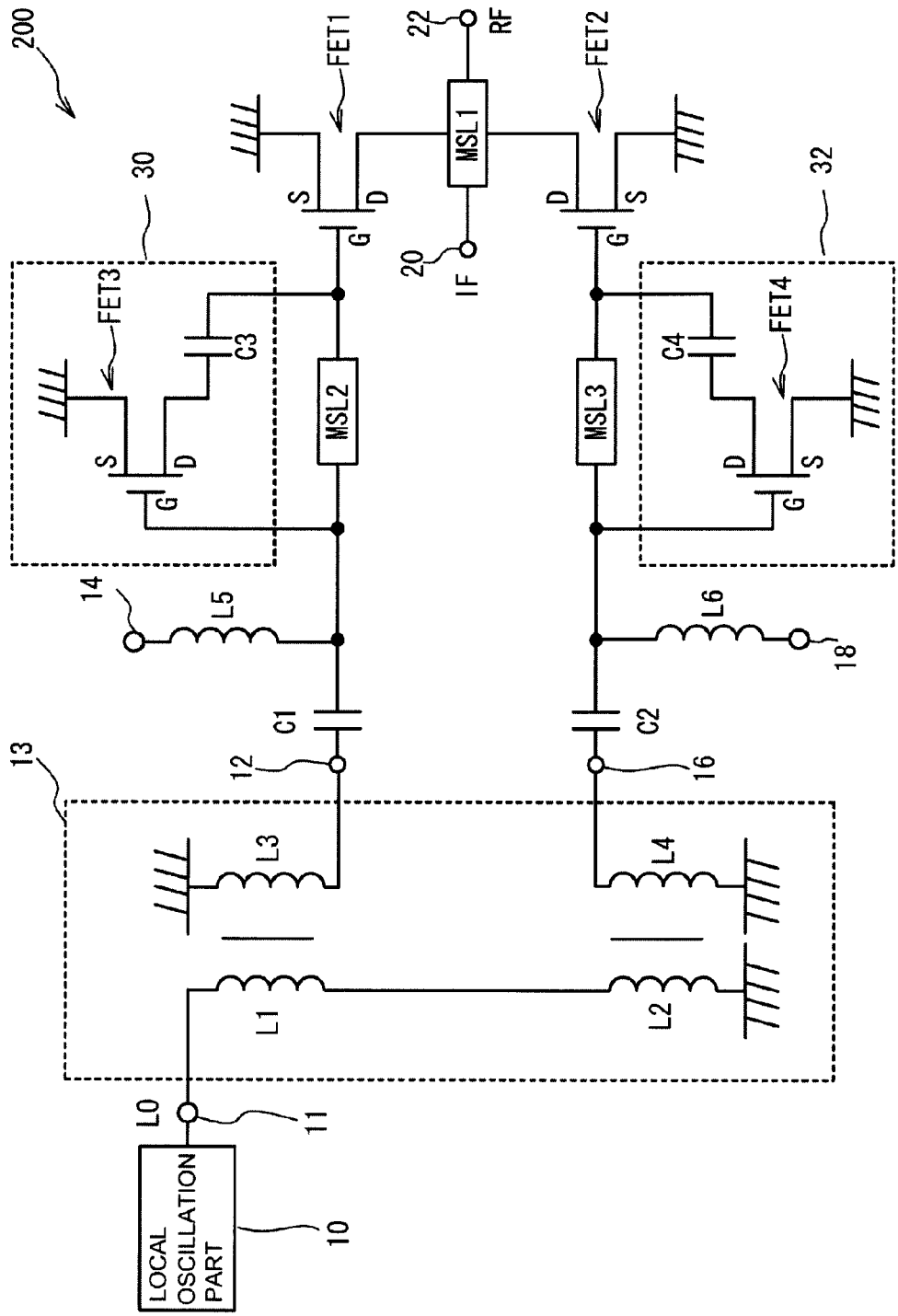
FIG. 4 is a circuit diagram of a harmonic mixer in accordance with a first embodiment.

A description will now be given, with reference to FIG. 4, of an exemplary electronic circuit in according to a first embodiment. FIG. 4 is a circuit diagram of a harmonic mixer 200 in accordance with the first embodiment. The harmonic mixer 200 differs from the harmonic mixer 100 in that the harmonic mixer 200 has a first harmonic generation part 30, a second harmonic generation circuit 32, a second transmission line MSL2 and a third transmission line MSL3. Any part illustrated in FIG. 4 that is the same as a part illustrated in FIG. 1 is denoted by the same reference in both figures, and a description thereof is omitted here.

The first harmonic generation part 30 has a third transistor FET3 and a condenser C3. The second harmonic generation part 32 has a fourth transistor FET4 and a condenser C4. The first harmonic generation part 30 is connected in parallel with the line from the terminal 12 to the first transistor FET1, and the second harmonic generation part 32 is connected in parallel with the line from the terminal 16 to the second transistor FET4. The third transistor FET3 is configured so that the drain D is connected to the gate of the first transistor FET1 via the capacitor C3, and the source S is connected to the ground potential, while the first LO signal is applied to the gate G. Similarly, the fourth transistor FET4 is configured so that the drain D is connected to the gate of the second transistor FET2 via the capacitor C4, and the source S is connected to the ground potential, while the second LO signal is applied to the gate G.

The third and fourth transistors FET3 and FET4 have the same characteristics as those of the first and second transistors FET1 and FET2, respectively, and generate harmonic components (hereinafter referred to harmonic compensation components) based on input signals applied thereto. When the phase of the signal applied to the gate of the first transistor FET1 is used as a reference, the harmonic compensation components generated by the third and fourth transistors FET3 and FET4 have phase differences P3 and P4 of 0° and 0° (360°), respectively. The harmonic compensation components generated by the third and fourth transistors FET3 and FET4 are applied to the gates of the first and second transistors FET1 and FET2, respectively, and are inverted thereby. Then, the inverted harmonic compensation components are output from the drains D of the first and second transistors FET1 and FET2 and are applied to the first transmission line MSL1. At this time, the phase differences P3 and P4 are 180° and 180° (540°), respectively. As has been described in connection with the comparative example, the phase differences P1 and P2 of the second harmonics output from the first and second transistors FET1 and FET2 are 0° and 0° (360°), respectively. The phase of the second harmonic generated by the first transistor FET1 is opposite to that of the harmonic compensation component generated by the third transistor FET3. It is thus possible to cancel the second harmonic generated by the first transistor FET1. Similarly, the second harmonic generated by the second transistor FET2 is canceled by the harmonic compensation component generated by the fourth FET4.

The condensers C3 and C4 are filters that attenuate the primary components of the first and second LO signals and pass harmonic components. The condenser C3 is provided between a node between the second transmission line MSL2 and the gate of the first transistor FET1 and the drain of the third transistor FET3. The condenser C4 is provided between a node between the third transmission line MSL3 and the gate of the second transistor FET2 and the drain of the fourth transistor FET4.

The second transmission line MSL2 is provided between the gate and the drain of the third transistor FET3. The first LO signal is applied to the gate of the first transistor FET1 via the second transmission line MSL2. The third transmission line MSL3 is provided between the gate and the drain of the fourth transistor FET4. The second LO signal is applied to the gate of the second transistor FET2 via the third transmission line MSL3. The second transmission line MSL2 and the third transmission line MSL3 adjust the phases of the first and second LO signals applied to the gates of the first and second transistors FET1 and FET2, respectively. The second and third transmission lines MSL2 and MSL3 may be microstrip lines, for example. The first and second transmission lines MSL2 and MSL3 adjust the phases of the first and second LO signals with respect to the control terminals (gates) of the first and second transistors FET1 and FET2. By adjusting the lengths of the second and third transmission lines MSL2 and MSL3, it is possible to appropriately adjust the phase relationship between the harmonic compensation components generated by the third and fourth transistors FET3 and FET4 and the second harmonics generated by the first and second transistors FET1 and FET2 and to effectively suppress the second harmonic components generated by the first and second transistors FET1 and FET2.

Figure 5:
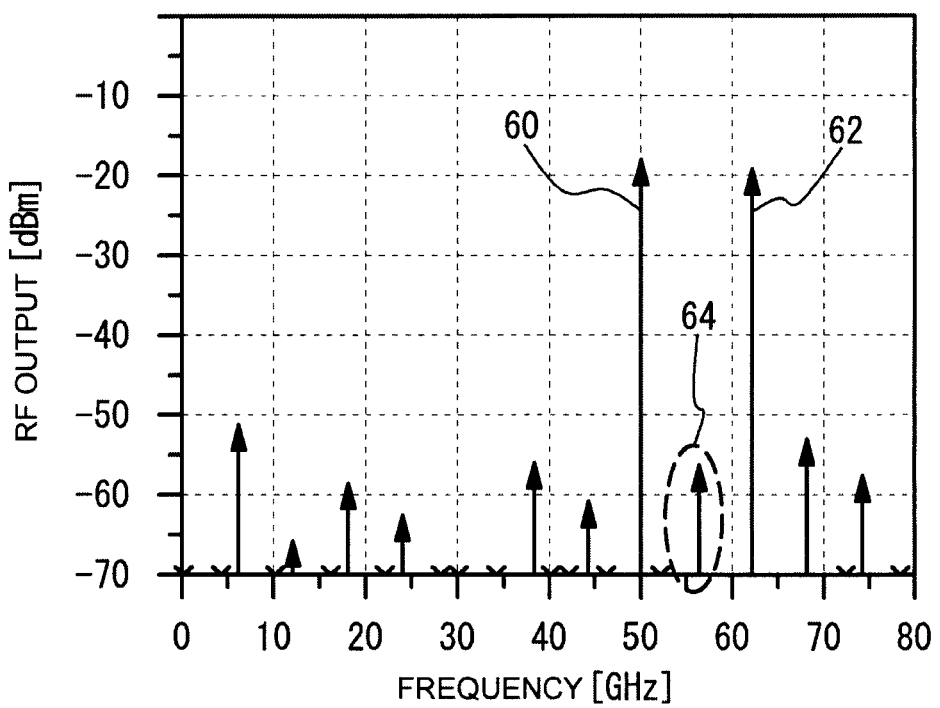
FIG. 5 is a graph of simulation results of the harmonic mixer of the first embodiment.

A description will now be given, with reference to FIG. 5, of a frequency distribution of the RF signal of the harmonic mixer 200. FIG. 5 is a graph of simulation results of the RF signal in accordance with the first embodiment, in which the conditions of the frequencies $f_1$ of the first and second LO signals and the frequency $f_2$ of the IF signal are the same as those in the case of FIG. 3. The horizontal axis of FIG. 5 denotes the frequency [GHz], and the vertical axis denotes power [dBm]. As illustrated in FIG. 5, the RF output is strong at frequencies of 50 GHz and 62 GHz as indicated by solid lines 60 and 62, respectively. In contrast, the second harmonic of the frequency twice the frequencies $f_1$ of the first and second LO signals surrounded by a broken line 64 is considerably suppressed, as compared to the second harmonic in FIG. 3.

According to the first embodiment, the harmonic mixer 200 has the first harmonic generation part 30 and the second harmonic generation part 32 that generate the harmonic compensation components that compensate for the second harmonics generated by the first and second transistors FET1 and FET2. It is thus possible to cancel the unwanted harmonic components by the harmonic compensation signals and to suppress the unwanted harmonic components from being output.

In the first embodiment, the first and second transistors FET1 and FET2 may be configured to be alternately turned ON and OFF at a frequency twice the frequencies f1 of the first and second LO signals. As has been described previously, one of the first and second transistors FET1 and FET2 is turned ON when the amplitude of one of the first and second LO signals is equal to or greater than the predetermined value, and both of them are turned OFF when the amplitudes of the first and second LO signals are zero. It is thus possible to restrain the unwanted harmonic components from being output from the harmonic mixer capable of generating the RF signal on the basis of the signal having the frequencies f1 twice the frequency of the input signal. The first and second transistors FET1 and FET2 are not limited to the enhancement type but may be of depletion type. In this case, one of the first and second transistors FET1 and FET2 is turned ON when one of the first and second LO signals has an amplitude equal to or smaller than the predetermined value, and both of them are turned OFF when the amplitudes of the first and second LO signals are zero. The first and second transistors FET1 and FET2 may be of bipolar type.

In the first embodiment, the first harmonic generation part 30 has the third transistor FET3 configured so that the drain D is connected to the gate of the first transistor FET1, and the source S is connected to the ground potential, while the first LO signal serving as a first oscillation signal is applied to the gate G. The second harmonic generation part 32 has the fourth transistor FET4 configured so that the drain D is connected to the gate of the second transistor FET2, and the source S is connected to the ground potential, while the second LO signal serving as a second oscillation signal is applied to the gate. It is thus possible to suppress the scale of the electronic circuit and realize cost reduction. The first and second harmonic generation parts 30 and 32 may have another configuration capable of generating the harmonic components that compensate for the harmonics generated by the first and second transistors FET1 an FET2. The third and fourth transistors FET3 and FET4 may be of bipolar type.

In the above description of the first embodiment, the first and second transistors FET1 and FET2 have the same characteristic, and the third and fourth transistors FET3 and FET4 have the same characteristic. The same characteristic may be realized by forming, on one substrate, FETs having an identical gate width, an identical gate length, an identical source width and an identical drain width. It is thus possible to generate the identical harmonic components having the same center frequency and the harmonic compensation components having the same center frequency and cancel the harmonic components precisely. Additionally, the use of the transistors having the same characteristics leads to cost reduction. The characteristics of the first and second transistors FET1 and FET2 may be different from those of the third and fourth transistors FET3 and FET4.

The above description of the first embodiment is directed to an exemplary case where the center frequency of the harmonic compensation components generated by the first and second harmonic generation parts 30 and 32 is the same as the center frequency f1 of the harmonic components generated by the first and second transistors FET1 and FET2. It is thus possible to cancel the harmonic components precisely. The center frequency of the harmonic compensation components may not be the same as the center frequency of the harmonic components.

The present invention is not limited to the specifically disclosed embodiments and variations, but other embodiments and variations may be made without departing from the scope of the present invention.

What is claimed is:

1. An electronic circuit comprising:
a first transmission line to which an input signal terminal and an output signal terminal are connected;
a first transistor having a first terminal connected to the first transmission line, a second terminal connected to a ground potential, and a control terminal supplied with a first oscillation signal, the first transistor outputting the first oscillation signal and a harmonic component thereof;
a second transistor having a first terminal connected to the first transmission line, a second terminal connected to the ground potential, and a control terminal supplied with a second oscillation signal, the second transistor outputting the second oscillation signal and a harmonic component thereof;
a first harmonic generation part connected to the control terminal of the first transistor and generates a harmonic component including the harmonic component generated by the first transistor; and
a second harmonic generation part connected to the control terminal of the second transistor and generates a harmonic component including the harmonic component generated by the second transistor,
wherein the harmonic component generated by the first harmonic generation part has a phase that cancels the harmonic component generated by the first transistor, and the harmonic component generated by the second harmonic generation part has a phase that cancels the harmonic component generated by the second transistor.

2. The electronic circuit according to claim 1, wherein:
the first harmonic generation circuit includes a third transistor having a first terminal connected to the control terminal of the first transistor, a second terminal connected to the ground potential and a control terminal supplied with the first oscillation signal; and
the second harmonic generation circuit includes a fourth transistor having a first terminal connected to the control terminal of the second transistor, a second terminal connected to the ground potential and a control terminal supplied with the second oscillation signal.

3. The electronic circuit according to claim 2, wherein the first and second transistors have an identical characteristic, and the third and fourth transistors have an identical characteristic.

4. The electronic circuit according to claim 2, further comprising:
a second transmission line connected between the control terminal of the third transistor and the first terminal of the third transistor; and
a third transmission line connected between the control terminal of the fourth transistor and the first terminal of the fourth transistor,
the first oscillation signal being applied to the control terminal of the first transistor via the second transmission line,
the second oscillation signal being applied to the control terminal of the second transistor via the second transmission line.

5. The electronic circuit according to claim 4, further comprising:
a first condenser connected between a node between the second transmission line and the control terminal of the first transistor and the first terminal of the third transistor; and
a second condenser connected between a node between the third transmission line and the control terminal of the second transistor and the first terminal of the fourth transistor.

6. The electronic circuit according to claim 1, wherein the first oscillation signal and the second oscillation signal are inverted.

7. The electronic circuit according to claim 6, wherein the first oscillation signal and the second oscillation signal are generated from a common local signal.

8. The electronic circuit according to claim 7, further comprising:
a 180° coupler having an input terminal, a first terminal and a second terminal, the input terminal receives the common local signal, the first output terminal outputs the first oscillation signal, and the second output terminal outputs the second oscillation signal.

9. The electronic circuit according to claim 8, wherein the 180° coupler comprised of a balun circuit.

10. The electronic circuit according to claim 6, wherein an IF signal is inputted into the input terminal connected with the first transmission line.

11. The electronic circuit according to claim 10, wherein an RF signal is outputted from the output terminal connected with the transmission line.

* * * * *